(12) United States Patent
Harada et al.

(10) Patent No.: US 7,811,874 B2
(45) Date of Patent: Oct. 12, 2010

(54) METHOD FOR MANUFACTURING SILICON CARBIDE SEMICONDUCTOR DEVICE, AND SILICON CARBIDE SEMICONDUCTOR DEVICE

(75) Inventors: Shinsuke Harada, Tsukuba (JP); Makoto Katou, Tsukuba (JP); Kenji Fukuda, Tsukuba (JP); Tsutomu Yatsuo, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 12/281,902

(22) PCT Filed: Jan. 16, 2007

(86) PCT No.: PCT/JP2007/050454
§ 371 (c)(1),
(2), (4) Date: Oct. 28, 2008

(87) PCT Pub. No.: WO2007/102281
PCT Pub. Date: Sep. 13, 2007

(65) Prior Publication Data
US 2009/0072244 A1 Mar. 19, 2009

(30) Foreign Application Priority Data
Mar. 7, 2006 (JP) .............................. 2006-060451

(51) Int. Cl.
*H01L 21/336* (2006.01)

(52) U.S. Cl. ........................ 438/198; 438/285; 438/586; 438/602; 438/660; 438/773; 438/931; 257/77; 257/628; 257/E21.062; 257/E21.067

(58) Field of Classification Search .................. 257/77, 257/744, E21.062, 628, E21.067; 438/586, 438/602, 773, 774, 198, 285, 660, 931
See application file for complete search history.

(56) References Cited

U.S. PATENT DOCUMENTS
6,940,110 B2 * 9/2005 Takahashi et al. ........... 257/288
2005/0245034 A1 11/2005 Fukuda et al.

FOREIGN PATENT DOCUMENTS
JP 6 97107 4/1994
(Continued)

OTHER PUBLICATIONS
Zhang, J. et al., "A High Current Gain 4H-SiC NPN Power Bipolar Junction Transistor", IEEE Electron Device Letters, vol. 24, No. 5, pp. 327-329 (2003).
(Continued)

*Primary Examiner*—Mary Wilczewski
*Assistant Examiner*—Toniae M Thomas
(74) *Attorney, Agent, or Firm*—Oblon, Spivak, McClelland, Maier & Neustadt, L.L.P.

(57) ABSTRACT

The object is to provide a method for the fabrication of a semiconductor device having undergone an anneal treatment for the purpose of forming such ohmic contact as enables decrease of ohmic contact resistance and being provided on the (000-1) plane of silicon carbide with an insulating film and provide the semiconductor device. The method for the fabrication of a silicon carbide semiconductor device includes the steps of performing thermal oxidation on the (000-1) plane of a silicon carbide semiconductor in a gas containing at least oxygen and moisture, thereby forming an insulating film in such a manner as to contact the (000-1) plane of the silicon carbide semiconductor, removing part of the insulating film, thereby forming an opening part therein, depositing contact metal on at least part of the opening part, and performing a heat treatment, thereby forming a reaction layer of the contact metal and silicon carbide, wherein the heat treatment is implemented in a mixed gas of an inert gas and hydrogen.

5 Claims, 5 Drawing Sheets

FOREIGN PATENT DOCUMENTS

| | | |
|---|---|---|
| JP | 10 112460 | 4/1998 |
| JP | 2000 133657 | 5/2000 |
| JP | 2000 252461 | 9/2000 |
| JP | 2004 319619 | 11/2004 |
| JP | 2005 260028 | 9/2005 |
| WO | 2004 003989 | 1/2004 |

OTHER PUBLICATIONS

Fursin, L.G. et al., "Nickel Ohmic Contacts to *p*- and *n*-Type 4H-SiC", Electronics Letters, vol. 37, No. 17, pp. 1092-1093 (2001).

Campi, J. et al., "Study of Interface State Density and Effective Oxide Charge in Post-Metallization Annealed $SiO_2$/SiC Structures", IEEE Transactions on Electron Devices, vol. 46, No. 3, pp. 511-519 (1999).

Fukuda, K. et al., "Effect of Gate Oxidation Method on Electrical Properties of Metal-Oxide-Semiconductor Field-Effect Transistors Fabricated on 4H-SiC C(0001) Face", Applied Physics Letters, vol. 84, No. 12, pp. 2088-2090 (2004).

Tanimoto, S. et al., "Ohmic Contact Structure and Fabrication Process Applicable to Practical SiC Devices", Materials Science Forum, vol. 389-393, pp. 879-884 (2002).

\* cited by examiner

METHOD FOR MANUFACTURING SILICON CARBIDE SEMICONDUCTOR DEVICE, AND SILICON CARBIDE SEMICONDUCTOR DEVICE

TECHNICAL FIELD

This invention relates to a method for the fabrication of a silicon carbide semiconductor device and the silicon carbide semiconductor device and more particularly relates to a method for the fabrication of a silicon carbide semiconductor device that incorporates therein a step for forming an ohmic electrode and is provided on the (000-1) plane of a silicon carbide semiconductor with an insulating film and the silicon carbide semiconductor device.

BACKGROUND ART

Silicon carbide (SiC), as compared with silicon (Si), possesses excellent physical properties, such as a wide band gap and large dielectric breakdown strength. By using silicon carbide (SiC) as a substrate material, therefore, it is made feasible to fabricate a power semiconductor device of high blocking voltage and low resistance that surpass the limits of silicon (Si).

Further, silicon carbide (SiC) is characterized, similarly to silicon (Si), by being capable of forming an insulating film by thermal oxidation. For this reason, it is inferred that a MOSFET of high blocking voltage and low on-resistance that uses silicon carbide (SiC) as a substrate material can be realized. Thus, many researches and developments directed toward this realization are now under way.

The developments of MOSFETs promoted to date have been performed on the (0001) plane because of the availability of epitaxial wafer that is excellent in crystallinity and comparatively inexpensive. On this plane, however, the MOS interface reveals low mobility of channel and renders a decrease of on-resistance difficult. In contrast, it has been reported as disclosed in Non-Patent Document 1 that on the (000-1) plane which is the back surface of the (0001) plane, the channel mobility of the MOS interface is greatly affected by the atmosphere of thermal oxidation and it exhibits a larger value than on the (0001) plane when the oxidation is performed in a wet atmosphere. It is, therefore, expected that the use of this plane will enable realization of a MOSFET of low on-resistance.

For the sake of enabling a silicon carbide MOSFET to decrease on-resistance and stabilize a structure of blocking voltage, the formation of ohmic contact proves to be an important technique. Particularly, since a p-type impurity element shows a low ratio of activation to a p-type region, no ohmic contact is derived from mere deposition of a metal. Generally, as disclosed in Non-Patent Document 2, for example, a technique for forming a reaction layer of metal and silicon carbide by implementing vapor deposition of the metal and subsequently annealing the resultant composite in argon at 1000° C. has been in use. Then, this method that is capable of acquiring ohmic contact with a p-type region has been being used in the semiconductor devices like a vertical MOSFET which form ohmic contact through both the n type and p type of minute contact holes in the surface.

Figure 8:
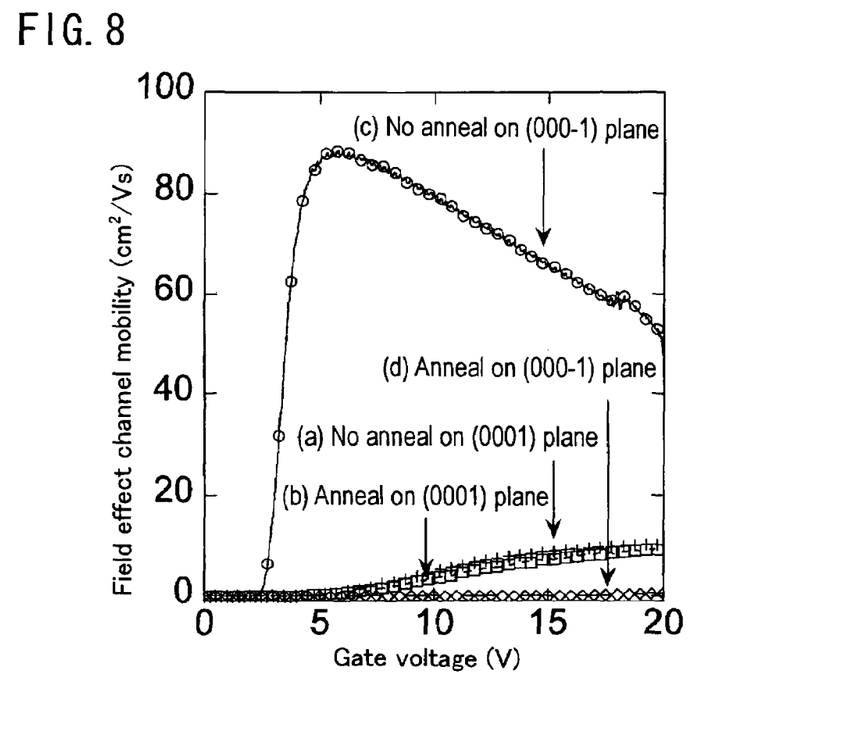
FIG. 8 This is a diagram depicting the dependency of the field effect channel mobility on the gate voltage in a horizontal MOSFET fabricated on a silicon carbide p-type substrate.

FIG. 8 is a drawing depicting the dependency of channel mobility on gate voltage in a horizontal MOSFET fabricated on a silicon carbide p-type substrate.

FIG. 8(a) and FIG. 8(b) depict formations of gate oxide film by wet oxidation at 1200° C. using the (0001) plane. FIG. 8(c) and FIG. 8(d) depict formations of gate oxide film by wet oxidation at 900° C. using the (000-1) plane. The ohmic contacts with the n-type source and drain regions in FIG. 8(a) and FIG. 8(c) are formed solely by vapor deposition of aluminum and those in FIG. 8(b) and FIG. 8(d) are formed by vapor deposition of nickel and subsequent annealing in an atmosphere of argon at 1000° C. for 2 minutes. The ohmic contacts with the p-type regions are obtained from the whole back surfaces of substrates. As regards characteristics, first on the (0001) plane, low channel mobility of about 10 cm$^2$/Vs is exhibited no matter whether ohmic contact anneal is present or absent. Meanwhile on the (000-1) plane, in FIG. 8(c) wherein anneal is absent, the electric current between the source and the drain is increased and the channel mobility is maximized to such a high level as about 88 cm$^2$/Vs when the gate voltage is increased and in FIG. 8(d) wherein anneal is present, the channel mobility is zero and absolutely no electric current flows without reference to the gate voltage.

Thus, the channel property of the MOSFET is conspicuously degraded by the ohmic contact anneal on the (000-1) plane, while it is not affected by the anneal on the (0001) plane. Consequently, the problem that the technique optimized on the (0001) plane will not be applicable to the (000-1) plane may arise.

Though the cause of this problem has not yet been elucidated in detail, the problem may be explained by supposing that when the oxidation is performed in a wet atmosphere, the efficiency with which hydrogen terminates interface level is higher on the (000-1) plane than on the (0001) plane and consequently the channel mobility is proportionately heightened but that when the anneal is implemented subsequently in an inert gas, hydrogen is easily desorbed from the interface level.

Non-Patent Document 1: Fukuda et al., Applied Physics Letters, Vol 84, pp. 2088-2090

Non-Patent Document 2: Tanimoto et al., Materials Science Forum, Vols. 389-393, pp. 879-884

DISCLOSURE OF THE INVENTION

Problem to be Solved by the Invention

As described above, in the method for forming ohmic contact onto a silicon carbide substrate, the procedure heretofore developed on the (0001) plane and comprising the steps of depositing metal on a high density layer and annealing the resultant composite in an inert gas does not affect the channel property when used in the process of fabricating a MOSFET on the (0001) plane, whereas it seriously degrades the channel property when used in the process of fabricating a MOSFET on the (000-1) plane. Thus, the procedure optimized on the (0001) plane encounters the problem that it will not be applicable to the (000-1) plane.

This invention, in view of the problem mentioned above and for the purpose of realizing a silicon carbide semiconductor device of low on-resistance, is aimed at providing a method for the fabrication of a semiconductor device that has undergone formation of an insulating film by wet oxidation in a process of oxidation and an anneal treatment adapted to form such ohmic contact as enables a decrease of ohmic contact resistance in a state of decreasing the density of interface level between the insulating film and the silicon carbide and is provided with an insulating film on the silicon carbide semiconductor (000-1) plane and providing the semiconductor device fabricated by the method.

Means to Solve the Problem

This invention has employed the following means with a view to solving the problem mentioned above.

The invention set forth in claim 1 concerns a method for the fabrication of a silicon carbide semiconductor device that comprises performing thermal oxidation on the (000-1) plane of a silicon carbide semiconductor in a gas containing at least oxygen and moisture, thereby forming an insulating film in such a manner as to contact the (000-1) plane of the silicon carbide semiconductor, removing part of the insulating film, thereby forming an opening part therein, depositing contact metal on at least part of the opening part, and performing a heat treatment thereby forming a reaction layer of the contact metal and silicon carbide wherein the heat treatment is implemented in a mixed gas comprising an inert gas and hydrogen.

The invention set forth in claim 2 and according to claim 1 concerns a method for the fabrication of a silicon carbide semiconductor device wherein the step of performing thermal oxidation in a gas containing at least oxygen and moisture, thereby forming an insulating film in such a manner as to contact the (000-1) plane of the silicon carbide semiconductor, constitutes at least part of a step of forming, a gate insulating film.

The invention set forth in claim 3 and according to claim 1 or claim 2 concerns a method for the fabrication of a silicon carbide semiconductor device, wherein the heat treatment is performed at a temperature in the range of from not less than 800° C. to not more than 1000° C.

The invention set forth in claim 4 and according to any one of claims 1 to 3 concerns a method for the fabrication of a silicon carbide semiconductor device, wherein the mixed gas of an inert gas and hydrogen has a hydrogen concentration in the range of from not less than 1% to not more than 20%.

The invention set forth in claim 5 and according to any one of claims 1 to 4 concerns a method for the fabrication of a silicon carbide semiconductor device, wherein the silicon carbide semiconductor has an off-angle from the (000-1) plane thereof in the range of from 0 degree to 1 degree.

The invention set forth in claim 6 concerns a silicon carbide semiconductor device fabricated by the invention according to any one of claims 1 to 5, wherein the insulating film has a hydrogen concentration in the range of from not less than $5\times10^{19}$ cm$^{-3}$ to not more than $1\times10^{22}$ cm$^{-3}$.

EFFECTS OF THE INVENTION

In accordance with this invention, since the process for fabricating a silicon carbide semiconductor device on the (000-1) plane comprises forming an insulating film by wet oxidation, terminating the interface level of the insulating film and silicon carbide with hydrogen, and subsequently performing ohmic contact anneal in a gas containing hydrogen, thereby inhibiting the hydrogen terminating the interface level of the insulating film and silicon carbide from being desorbed during the course of annealing, it is made possible to obtain high channel mobility, decrease the ohmic contact, and hence enable fabrication of a silicon semiconductor device of low on resistance.

EXPLANATION OF REFERENCE NUMERALS

1 n-Type 4H—SiC (000-1) substrate
2 n-Type epitaxial film
3 Insulating film
4 Al gate electrode
5 Al back surface electrode
6 C-V meter
7 p-Type 4H—SiC (000-1) substrate
8 p-Type epitaxial film
9 Mask phosphorus ion
10 Phosphorus ion
11 Mask
12 Aluminum ion
13 Drain region
14 Source region
15 Ground region
16 Field oxide film
17 Active region
18 Gate insulating film
19 Gate electrode
20 Contact metal
21 Reaction layer
22 Pad electrode
23 Back surface electrode

BEST MODE FOR CARRYING OUT THE INVENTION

The first embodiment of this invention will be described with reference to FIG. 1 and FIG. 2.

Figure 1:
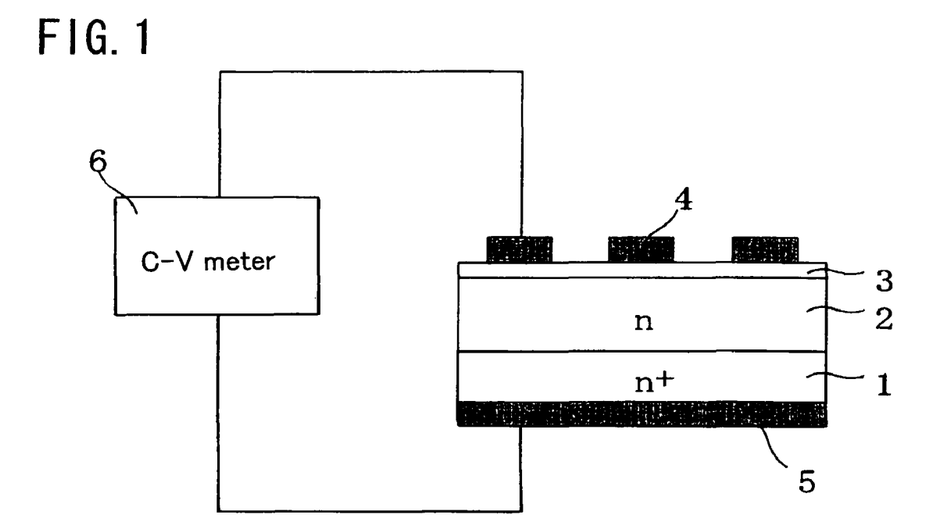
FIG. 1 This is a diagram depicting the structure of a MOS capacitor according to this invention.

FIG. 1 is a diagram that depicts the structure of a MOS capacitor according to this invention.

This MOS capacitor is fabricated as follows.

First, an n-type epitaxial film 2 having a donor density of $1\times10^{16}$ cm$^{-3}$ is grown on a 0 to 8-degree-off substrate (preferably 0 to 1-degree-off substrate) from the (000-1) plane of an n-type 4H—SiC (000-1) substrate 1. Incidentally, the 4H—SiC substrate in a single form or the 4H—SiC substrate in combination with the epitaxial film will be called a 4H—SiC semiconductor.

After the 4H—SiC semiconductor is cleaned, it is subjected to wet oxidation at 900° C. over a period of 120 minutes to form an insulating film 3 measuring 50 nm in thickness and cooled to room temperature. The atmosphere used during the cooling may be an inert gas, such as argon or nitrogen, and the switch from the wet atmosphere to the inert gas may take place about 30 minutes prior to starting the cooling. After the cooling has reached room temperature, the resultant insulated 4H—SiC semiconductor is retained in argon gas or a forming gas (He+1 to 20% H$_2$, preferably He+1 to 4% H$_2$, or particularly preferably He+3.4% H$_2$) at 900° C. for 2 minutes and annealed for a temperature raising and lowering period of 1 minute. Thereafter, an Al gate electrode 4 in a dotted form is vapor-deposited on the insulating film 3 and an MOS capacitor formed with an Al back surface electrode 5 resulting from vapor-depositing Al on the whole back surface is fabricated. Capacity-voltage determination between the front surface and the back surface has been implemented by using a C-V meter 6 to investigate the influence of the anneal atmosphere on the interface level density of an oxide film.

Figure 2:
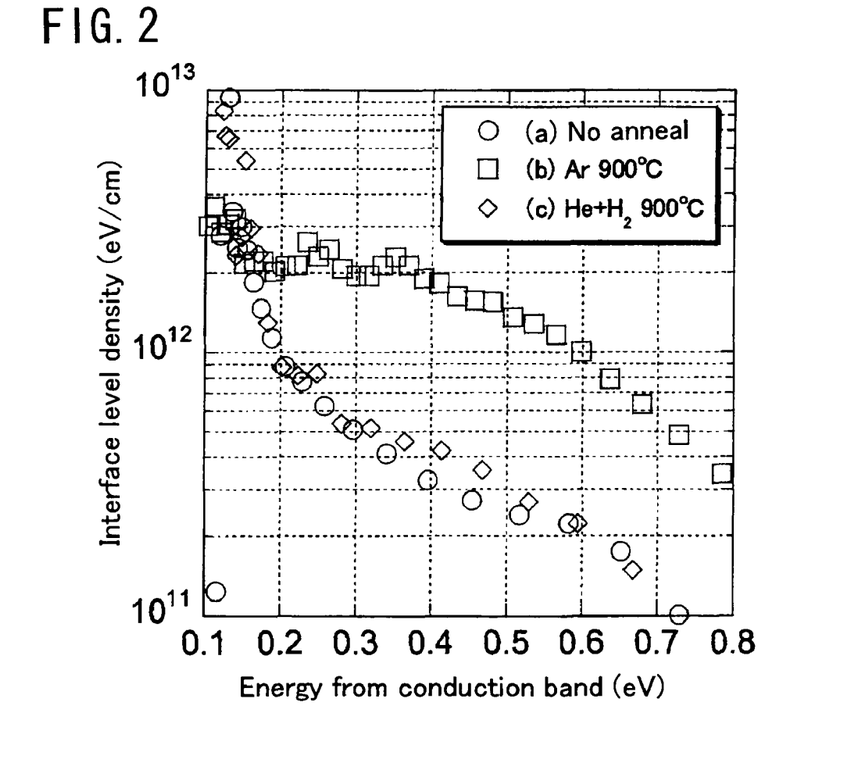
FIG. 2 This is a diagram depicting the interface level density distribution obtained from the results of the determination of the MOS capacitor according to this invention and a MOS capacitor prepared for the purpose of comparison with the MOS capacitor of this invention.

FIG. 2 is a diagram depicting the interface level density distribution obtained from the results of the determination of the MOS capacitor according to this invention illustrated in FIG. 1 and a MOS capacitor fabricated for the purpose of comparison with the MOS capacitor of this invention.

As shown in this diagram, the MOS capacitor of FIG. 2(b) annealed in argon gas is found to greatly increase the interface level density as compared with the MOS capacitor of FIG. 2(a) undergone no annealing, whereas the MOS capacitor of FIG. 2(c) annealed in the forming gas is found to increase the interface level density very little.

Thus, it is clear from the results of the determination that by implementing the anneal of an oxide film formed by wet oxidation in an atmosphere containing hydrogen, it is made possible to prevent the low interface level density obtained by wet oxidation from being increased by the anneal.

Next, the second embodiment of this invention will be described with reference to FIG. 3 through FIG. 6.

Figure 3:
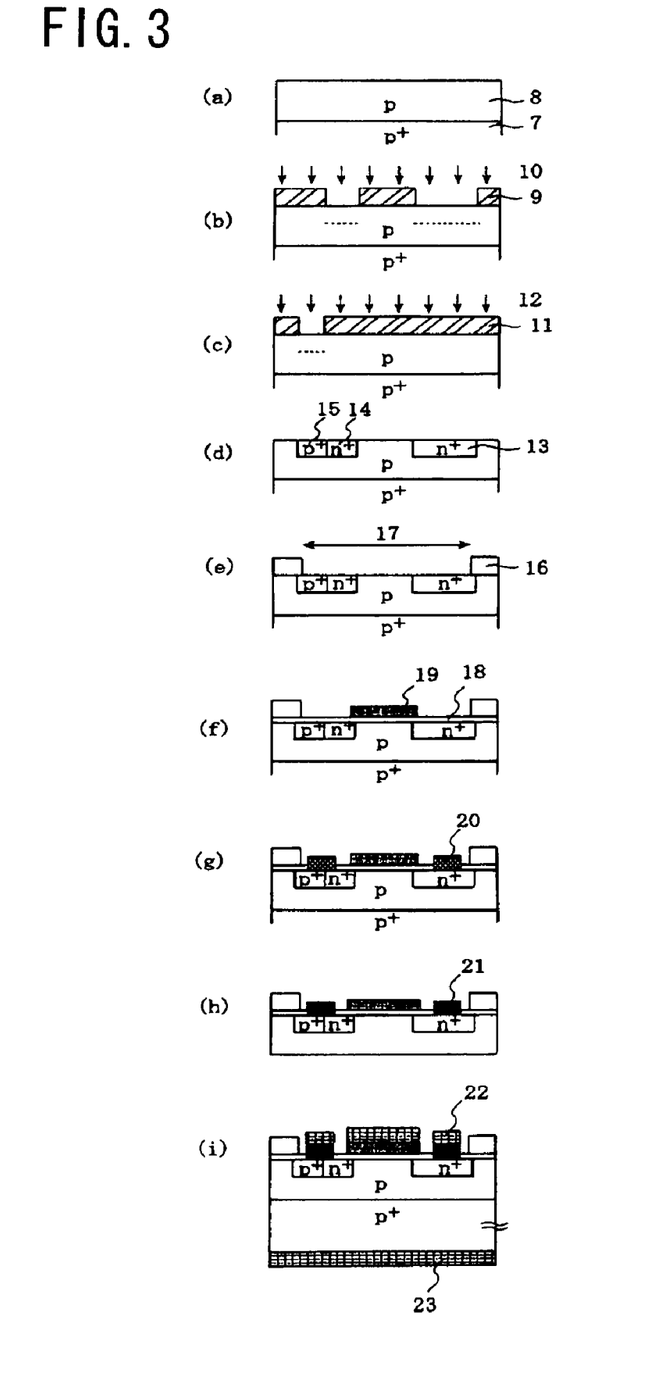
FIG. 3 This is a cross section drawn for the purpose of explaining the method of this invention for the fabrication of a MOSFET on the silicon carbide (000-1) plane.

FIG. 3 is a cross section drawn for the purpose of explaining the method of this invention for the fabrication of a MOSFET on the silicon carbide (000-1) plane.

First, a p-type epitaxial film 8 having an acceptor density of $1\times10^{16}$ cm$^{-3}$ is grown on a 0 to 8-degree-off substrate (preferably 0 to 1-degree-off substrate) from the (000-1) plane of a p-type 4H—SiC (000-1) substrate 1 as shown in FIG. 3(a). Incidentally, the 4H—SiC substrate in a single form or the 4H—SiC substrate in combination with the epitaxial film will be called a 4H—SiC semiconductor.

Next, as shown in FIG. 3(b), an SiO$_2$ film measuring 1 μm in thickness is deposited on the surface of a p-type epitaxial film 8 by the low pressure CVD method and patterned by photolithography to form a mask 9. Thereafter, a phosphorus ion 10, for example, is implanted under the conditions, 500° C. in substrate temperature, 40 keV to 250 keV in multistage acceleration energy and $2\times10^{20}$ cm$^{-3}$ in amount of implantation.

Then, as shown in FIG. 3(c), the mask 9 is removed and an SiO$_2$ film measuring 1 μm in thickness is deposited on the surface by the low pressure CVD method and patterned by photolithography to form a mask 11. Thereafter, an aluminum ion 12, for example, is implanted under the conditions, 500° C. in substrate temperature, 40 keV to 200 keV in multistage acceleration energy and $2\times10^{20}$ cm$^{-3}$ in amount of implantation.

Thereafter, as shown in FIG. 3(d), the mask 11 is removed and activation anneal is carried out in an argon atmosphere at 1600° C. over a period of 5 minutes to form a drain region 13, a source region 14 and a ground region 15.

Then, as shown in FIG. 3(e), a field oxide film 16 measuring 0.5 μm in thickness is deposited by the low pressure CVD method and subjected to photolithography and wet etching to form an active region 17.

Then, as shown in FIG. 3(f), thermal oxidation is carried out in a wet atmosphere at 900° C. to form a gate insulating film 18 measuring 50 nm in thickness. Polycrystalline silicon is deposited in a thickness of 0.3 μm on the gate insulating film 18 by the low pressure CVD method and patterned by photolithography to form a gate electrode 19.

Then, as shown in FIG. 3(g), contact holes are formed on the drain region 13, source region 14 and ground region 15 by photolithography and etching with hydrofluoric acid and aluminum 10 nm thick and nickel 60 nm thick are vapor-deposited thereon and patterned by liftoff to form a contact metal 20.

Subsequently, as shown in FIG. 3(h), anneal is carried out in a forming gas (He+1 to 20% H$_2$, preferably He+1 to 4% H$_2$, or particularly preferably He+3.4% H$_2$) by means of retention at 1000° C. for 2 minutes and use of temperature raising and lowering period of 1 minute to form a reaction layer 21 composed of the contact metal 20 and silicon carbide.

Then, as shown in FIG. 3(i), aluminum is vapor-deposited in a thickness of 300 nm on the surface and subjected to photolithography and etching with phosphoric acid to form a pad electrode 22 on both the gate electrode 19 and the reaction layer 21 and aluminum is vapor-deposited in a thickness of 100 nm on the back surface to form a back surface electrode 23.

Figure 4:
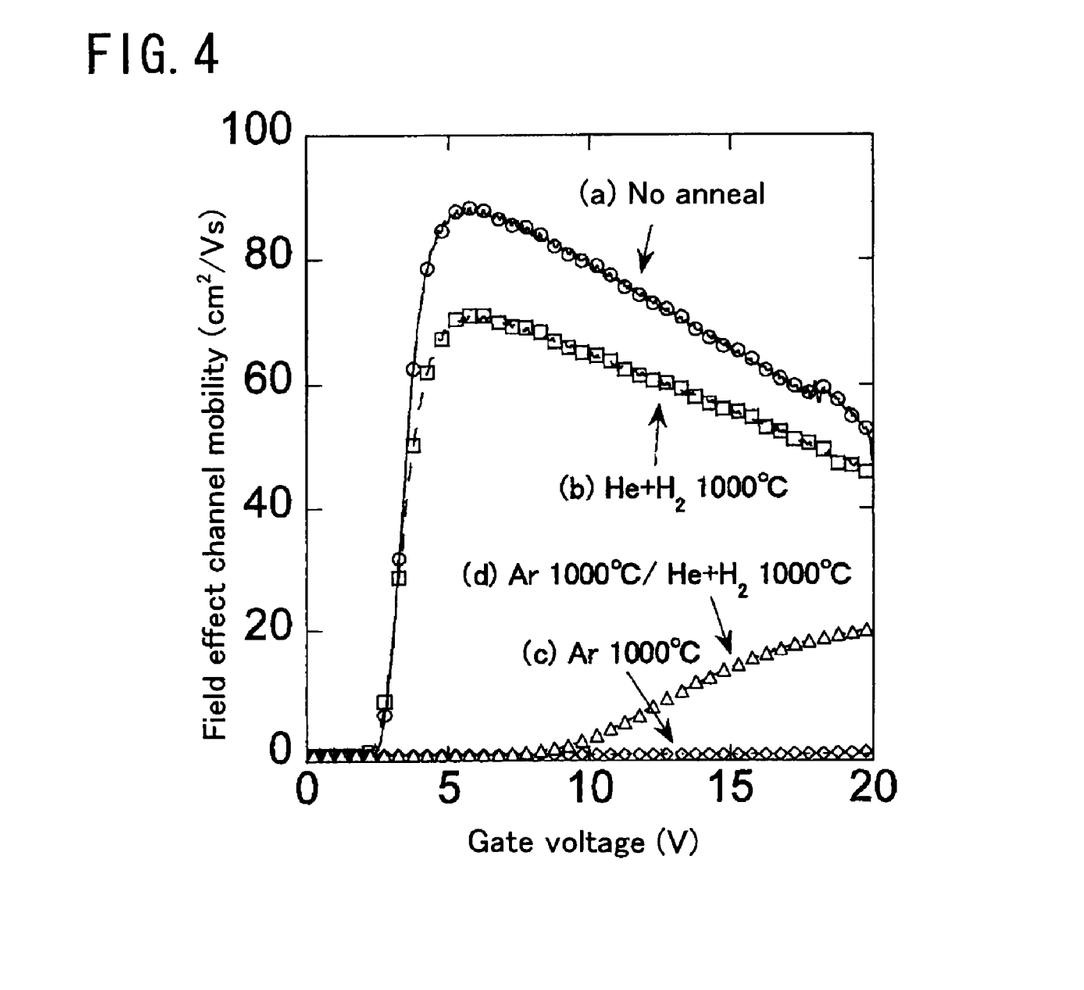
FIG. 4 This is a diagram depicting the dependencies of the field effect channel mobilities on the gate voltage found respectively in the silicon carbide MOSFET prepared by the method for the fabrication of a silicon carbide MOSFET shown in FIG. 3 and in a silicon carbide MOSFET prepared by varying the step of FIG. 3(*h*) in FIG. 3.

FIG. 4 is a diagram depicting the dependencies of the channel mobilities on the gate voltage found respectively in the silicon carbide MOSFET fabricated by the method for the fabrication of a silicon carbide MOSFET shown in FIG. 3 and a silicon carbide MOSFET fabricated by varying the step of FIG. 3(h) in FIG. 3.

In this diagram, FIG. 4(a) delineates the results obtained in the case of forming ohmic contact without anneal in the step of FIG. 3(h) and deriving the ohmic contact of the p-type region from the back surface of the substrate, FIG. 4(b) those obtained in the case of carrying out anneal in the forming gas in the step of FIG. 3(h), FIG. 4(c) those obtained in the case of carrying out anneal not in the forming gas but in argon in the step of FIG. 3(h), and FIG. 4(d) those obtained in the case of carrying out anneal in argon in the step of FIG. 3(h) and, after the temperature is lowered to room temperature, carrying out the anneal again in the forming gas at the same temperature.

While the case of FIG. 4(a) performing no anneal shows channel mobility of such a high value as about 88 cm$^2$/Vs tops, the case of FIG. 4(c) performing anneal in argon gas allows absolutely no flow of drain current. This is because the use of anneal results in desorption of hydrogen notwithstanding the channel mobility is heightened by causing the wet oxidation to make hydrogen terminate interface level. In contrast, the case of FIG. 4(b) performing anneal in the forming gas shows channel mobility of 70 cm$^2$/Vs tops, indicating that the degradation of channel mobility is small as compared with the case of using no anneal and that the inclusion of hydrogen in the anneal atmosphere can prevent the hydrogen from being desorbed from the interface level during the course of the anneal. Then, the case of FIG. 4(d) shows channel mobility of about 25 cm²/Vs tops, a value approximately one third of the value of the case of FIG. 4(a), indicating that once anneal is performed after gate oxidation in an atmosphere containing no hydrogen, anneal performed thereafter in an atmosphere containing hydrogen does no longer enable resumption of the former state.

Thus, in accordance with the method of this invention for the fabrication of a MOSFET on the (000-1) plane of silicon carbide, it is made possible by forming a gate oxide film by wet oxidation and subsequently performing ohmic contact anneal in an atmosphere containing hydrogen to prevent the anneal from desorbing the hydrogen that has terminated the interface level during the course of gate oxidation and hence realize high channel mobility.

Figure 5:
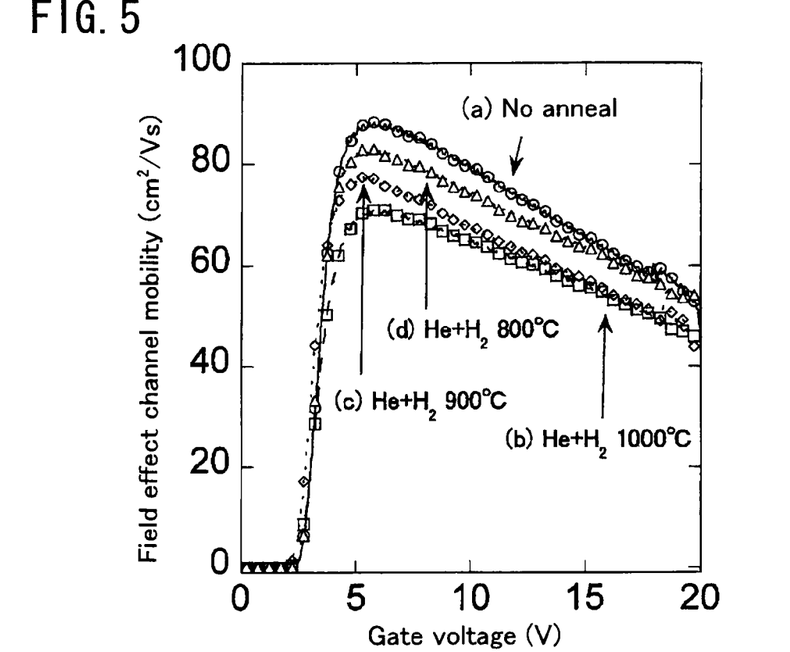
FIG. 5 This is a diagram depicting the dependencies of the field effect channel mobilities on the gate voltage found in silicon carbide MOSFETs fabricated by using as parameters the anneal temperatures in the process of anneal in a forming gas (He+3.4% H$_2$) delineated by FIG. 3(*h*) in FIG. 3.

FIG. 5 is a diagram depicting the dependencies of the channel mobilities on the gate voltage found in silicon carbide MOSFETs fabricated using as parameters the anneal temperatures in the process of anneal in a forming gas (He+3.4% H$_2$) delineated by FIG. 3(h) in FIG. 3.

In the diagram, FIG. 5(a) delineates the results obtained in the case of forming ohmic contact without anneal and deriving ohmic contact of the p-type region from the back surface of the substrate, and FIG. 5(b), FIG. 5(c) and FIG. 5(d) delineate those obtained in the cases of performing anneal in a forming gas respectively at 1000° C., 900° C. and 800° C. The anneal performed at 1000° C. shows such high channel mobility as about 70 cm²/Vs tops and the decrease of anneal temperature further raises channel mobility. These results clearly indicate that the anneal is favorably performed at a temperature of not more than 1000° C.

Thus, according to the silicon carbide MOSFET of this invention, it is made possible by performing ohmic contact anneal in an atmosphere containing hydrogen below 1000° C. in the process for fabricating MOSFET on the (000-1) plane to prevent effectively the anneal from desorbing the hydrogen that has terminated the interface level during the course of gate oxidation and hence realize high channel mobility.

Figure 6:
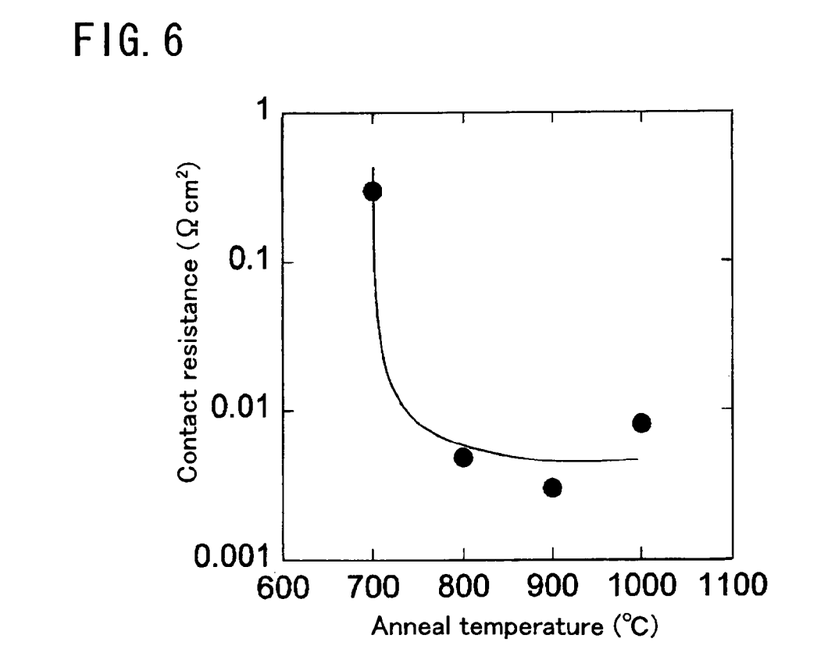
FIG. 6 This is a diagram depicting the results of determining the ohmic contact resistance to the p-type region in the TLM structure while changing the temperature of the forming gas anneal in the process for annealing in a forming gas (He+3.4H$_2$) delineated by FIG. 3(*h*) in FIG. 3.

FIG. 6 is a diagram depicting the results of determining the ohmic contact resistance to the p-type region in the TLM structure while changing the temperature of the forming gas anneal in the process for annealing in a forming gas (He+ 3.4H$_2$) delineated by FIG. 3(h) in FIG. 3.

The sample for the determination is prepared by first implanting an aluminum ion in an n-type 4H—SiC (000-1) substrate under the conditions, 500° C. in substrate temperature, 40 keV to 200 keV in multistage acceleration energy and $2\times10^{20}$ cm$^{-3}$ in amount of implantation and performing activation anneal at 1600° C. for 5 minutes. Thereafter, a contact metal formed of a stacked structure of aluminum and nickel is deposited, patterned, subjected to anneal in a forming gas and overlaid with a pad electrode.

The results of determination of FIG. 6 clearly indicate that the contact resistance shows no dependency on the anneal temperature above 800° C. but the anneal at 700° C. suddenly raises the contact resistance. These results allow a conclusion that the forming gas anneal temperature for the purpose of forming an ideal ohmic contact with the p-type region proves to be suitable above 800° C.

Thus, according to the silicon carbide MOSFET of this invention, ohmic contact possessing low contact resistance can be realized because the ohmic contact anneal in an atmosphere containing hydrogen on the (000-1) plane is performed above 800° C.

Figure 7:
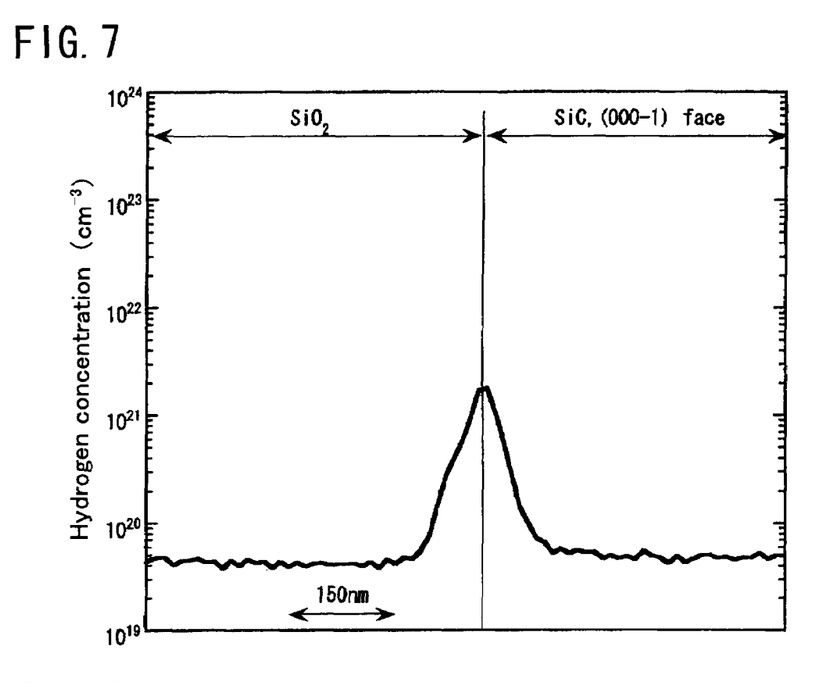
FIG. 7 This is a diagram depicting the results of determining by the secondary ion mass spectroscopy the amount of hydrogen element in the neighborhood of the interface of the oxide film and the silicon carbide substrate in the silicon carbide MOSFET fabricated by the method for fabricating a silicon carbide MOSFET illustrated in FIG. 3.

FIG. 7 delineates the results of determining by the secondary ion mass spectroscopy the amount of hydrogen element in the neighborhood of the interface of the oxide film and the silicon carbide substrate in the silicon carbide MOSFET fabricated by the method for fabricating the silicon carbide MOSFET illustrated in FIG. 3. The hydrogen concentration in the neighborhood of the interface is about $1\times10^{21}$ cm$^{-3}$, indicating that hydrogen is contained in a large amount as compared with other regions.

Thus, according to the method of this invention for the fabrication of a MOSFET on the (000-1) plane of silicon carbide, it is seen that the interface between the oxide film and silicon carbide is enabled to contain hydrogen in a large amount by performing the ohmic contact anneal in an atmosphere containing hydrogen after forming the gate oxide film by wet oxidation.

While the invention of the present embodiment has been described by adducing as an example the method for fabricating a horizontal MOSFET as a silicon carbide MOSFET, it is not limited to this example but is applicable to a semiconductor device that possesses such a structure of high blocking voltage as a horizontal MOSFET and is capable of exhibiting the same effect. Accordingly, it can be applied to various methods for fabricating semiconductor devices without departure from the gist of the invention set forth in the claims.

The invention claimed is:

1. A method for the fabrication of a silicon carbide semiconductor device comprising:
   performing thermal oxidation on the (000-1) plane of a silicon carbide semiconductor in a gas containing at least oxygen and moisture, thereby forming an insulating film in such a manner as to contact the (000-1) plane of the silicon carbide semiconductor;
   removing part of the insulating film, thereby forming an opening part therein;
   depositing contact metal on at least part of the opening part; and
   performing a heat treatment, thereby forming a reaction layer of the contact metal and silicon carbide, wherein the heat treatment is implemented in a mixed gas of an inert gas and hydrogen.

2. The method for the fabrication of a silicon carbide semiconductor device according to claim 1, wherein said performing thermal oxidation in a gas containing at least oxygen and moisture, thereby forming an insulating film in such a manner as to contact the (000-1) plane of the silicon carbide semiconductor includes at least forming a gate insulating film.

3. The method for the fabrication of a silicon carbide semiconductor device according to claim 2, wherein the heat treatment is performed at a temperature in a range of from not less than 800° C. to not more than 1000° C.

4. The method for the fabrication of a silicon carbide semiconductor device according to any one of claims 1 to 3, wherein the mixed gas of an inert gas and hydrogen has a hydrogen concentration in a range of from not less than 1% to not more than 20%.

5. The method for the fabrication of a silicon carbide semiconductor device according to claim 4, wherein the said silicon carbide semiconductor has an off-angle from the (000-1) plane thereof in a range of from 0 degree to 1 degree.

* * * * *